(12) United States Patent
Torres et al.

(10) Patent No.: US 12,279,375 B2
(45) Date of Patent: Apr. 15, 2025

(54) INFORMATION HANDLING SYSTEMS WITH A FLEXIBLE PRINTED CIRCUIT TENSIONING SYSTEM AND METHODS OF MAKING THE SAME

(71) Applicant: Dell Products L.P., Round Rock, TX (US)

(72) Inventors: Chris A. Torres, San Marcos, TX (US); Tzu-Chau Chen, Wenshan District (TW); Li-Min Wu, Taoyuan (TW)

(73) Assignee: Dell Products L.P., Round Rock, TX (US)

( * ) Notice: Subject to any disclaimer, the term of this patent is extended or adjusted under 35 U.S.C. 154(b) by 312 days.

(21) Appl. No.: 18/174,852

(22) Filed: Feb. 27, 2023

(65) Prior Publication Data

US 2024/0292542 A1    Aug. 29, 2024

(51) Int. Cl.
*H05K 1/18*    (2006.01)
*H05K 1/02*    (2006.01)

(52) U.S. Cl.
CPC ............. *H05K 1/189* (2013.01); *H05K 1/028* (2013.01); *H05K 2201/0999* (2013.01); *H05K 2201/10037* (2013.01); *H05K 2201/10128* (2013.01); *H05K 2201/2063* (2013.01)

(58) Field of Classification Search
CPC .................. H05K 1/189; H05K 1/028; H05K 2201/0999; H05K 2201/10037; H05K 2201/10128; H05K 2201/2063
USPC ......................................................... 361/749
See application file for complete search history.

(56) References Cited

U.S. PATENT DOCUMENTS

| | | | | |
|---|---|---|---|---|
| 2020/0060020 A1* | 2/2020 | Park | ...................... | H05K 1/028 |
| 2022/0151070 A1* | 5/2022 | Lee | ......................... | H05K 1/118 |
| 2022/0346224 A1* | 10/2022 | Lee | ....................... | H05K 1/0277 |
| 2024/0007551 A1* | 1/2024 | Seo | ......................... | H05K 1/118 |

* cited by examiner

*Primary Examiner* — Binh B Tran
(74) *Attorney, Agent, or Firm* — Norton Rose Fulbright US LLP

(57) ABSTRACT

An information handling system can comprise first and second housings having pivotally coupled rear edge portions such that the housings are pivotable between open and closed states. A hinge cover can extend along at least a portion of each housing's rear edge portion. A flexible printed circuit having opposing upper and lower surfaces can extend between the housings. The circuit can include a cover segment in which the circuit's upper surface is fixed to the hinge cover's inner surface, two housing segments that are each fixed to a respective one of the housings, and two free segment that each connect a respective one of the housings segments to the cover segment, are movable relative to the hinge cover and to the housings when the housings pivot between the open and closed states, and underlie the inner surface of the hinge cover when the housings are in the open state.

20 Claims, 12 Drawing Sheets

INFORMATION HANDLING SYSTEMS WITH A FLEXIBLE PRINTED CIRCUIT TENSIONING SYSTEM AND METHODS OF MAKING THE SAME

FIELD OF INVENTION

The present invention relates generally to foldable information handling systems that include a printed flexible circuit.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Some information handling systems include a flexible printed circuit that can electrically couple two or more components of the information handling system for the transmission of data and/or power. In foldable systems with housings that may be pivotable between open and closed states—such as laptops, tablet computers, and mobile devices like smart phones—challenges may arise when the components that are electrically coupled are in different housings of the information handling system. In such systems, the flexible printed circuit may extend between the housings and thus may need to be able to move to account for a change in routing length when the housings pivot between the open and closed states. Such movement can exert stresses on the flexible printed circuit that cause wear that may eventually lead to catastrophic system failure. Additionally, the routing of the flexible printed circuit to allow for movement thereof when the housings pivot between the open and closed states is often space-inefficient: conventionally, relatively long portions of the flexible printed circuit are disposed in the housings to allow for the requisite circuit movement, which can occupy space that could otherwise be occupied by other system components (e.g., an otherwise-larger battery) and can require more printed circuit material, thereby increasing costs.

SUMMARY

Some of the present information handling systems can include a flexible printed circuit that extends between first and second housings of the information handling system that are pivotable between open and closed states, where the flexible printed circuit is routed in a space-efficient manner to allow for sufficient circuit movement when the housings pivot. The flexible printed circuit can include a cover segment, two housing segments, and two free segments. The upper surface of the flexible printed circuit in the cover segment can be fixed to the inner surface of a hinge cover that extends along at least a portion of the rear edge portion of each of the first and second housings, while each of the housing segments can be fixed to the rear edge portion of a respective one of the housings. Each of the free segments, which can connect a respective one of the housing segments to the cover segment, need not be fixed to the housings or to the hinge cover such that the free segment can move relative to the hinge cover and to the housings when the housings pivot between the open and closed states, thereby permitting circuit movement in the free segments to accommodate the change in routing length that occurs when the housings pivot between the open and closed states. Unlike conventional flexible printed circuit routing, the free segments can each underlie the inner surface of the hinge cover when the housings are in the open (and, optionally, closed) states, and thus may require less flexible printed circuit material (e.g., thereby saving costs) and allow for more free space in the housings (e.g., to accommodate a larger battery and/or other components).

The geometry of the flexible printed circuit in the free segments can facilitate this space-efficient routing and mitigate wear on the flexible printed circuit from the pivoting of the housings. For example, each of the free segments can comprise first and second parts, the first part connecting the second part to the cover segment; when the housings are in the open state, the upper surface of the flexible printed circuit can be convex and subtend an angle that is greater than 90° in the first part and can be concave and subtend an angle that is greater than 90° in the second part. The flexible printed circuit's upper surface can readily extend out of this curved geometry when the housings pivot to the closed state, e.g., such that the angles the flexible printed circuit's upper surface subtends in the first and second parts of each of the free segments are larger when the housings are in the open state than when the housings are in the closed state, thereby mitigating wear on the flexible printed circuit when the housings pivot between the open and closed states.

The free segments of the flexible can have other geometries too. For example, in some systems each of the free segments can be helical. While the helical geometry may not be as space-efficient as the above-described curved geometry with convex and concave parts, it can mitigate wear on the flexible printed circuit when the housings pivot between the open and closed states.

Some of the present information handling systems comprise first and second housings. The housings, in some systems, each have opposing front and rear edge portions. Some systems comprise a hinge cover that has opposing inner and outer surface and extends along at least a portion of the rear edge portion of each of the first and second housings. Some systems comprise a flexible printed circuit that has opposing upper and lower surfaces and extends between the first and second housings. The flexible printed circuit, in some systems, comprises a cover segment, two housing segments, and two free segments. In some systems, the upper surface of the flexible printed circuit in the cover segment is fixed to the inner surface of the hinge cover. In some systems, the inner surface of the hinge cover comprises an electrically-conductive material. The upper surface of the flexible printed circuit, in some systems, is fixed to the inner surface of the hinge cover at least with an electrically-conductive adhesive.

Some of the present methods of making an information handling system comprise fixing an upper surface of a flexible printed circuit in a cover segment of the flexible printed circuit to an inner surface of a hinge cover. Fixing the upper surface of the flexible printed circuit in the cover segment to the inner surface of the hinge cover, in some methods, comprises adhering the upper surface of the flexible printed circuit in the cover segment to the inner surface of the hinge cover with an electrically-conductive adhesive. Some methods comprise, while the upper surface of the flexible printed circuit in the cover segment is fixed to the inner surface of the hinge cover, coupling the hinge cover to first and second housings that each have opposing front and rear edge portions such that the hinge cover extends along at least a portion of the rear edge portion of each of the first and second housings. In some methods, the hinge cover is coupled to the first and second housings when the first and second housings are in the open state.

In some embodiments, the rear edge portion of the second housing is pivotally coupled to the rear edge portion of the first housing such that the first and second housings are pivotable between open and closed states. In some embodiments, when the first and second housings are in the closed state, the front edge portion of the second housing is disposed closer to the front edge portion of the first housing than when the first and second housings are in the open state. A front face of the first housing, in some embodiments, is substantially parallel with a front face of the second housing when the first and second housings are in the open state. In some embodiments, the front face of the first housing faces the front face of the second housing when the first and second housings are in the closed state.

In some systems, each of the housing segments of the flexible printed circuit is fixed to the rear edge portion of a respective one of the first and second housings, and some methods comprise fixing each of two housing segments of the flexible printed circuit to the rear edge portion of a respective one of the first and second housings. In some embodiments, the first and second housings each comprise a metallic layer. In some systems, each of the housing segments is fixed to the metallic layer of a respective one of the first and second housings at least with an electrically-conductive adhesive disposed between the metallic layer and the lower surface of the flexible printed circuit in the housing segment and a bracket that is fastened to the metallic layer and overlies the housing segment. Some of such systems comprise, for each of the housing segments, a layer of polymeric material disposed between the bracket and the upper surface of the flexible printed circuit in the housing segment. In some methods, fixing each of the housing segments to the rear edge portion of a respective one of the first and second housings comprises adhering a lower surface of the flexible printed circuit that opposes the upper surface of the flexible printed circuit to the metallic layer of the housing with an electrically-conductive adhesive and fastening a bracket to the metallic layer such that the bracket overlies the housing segment. In some of such methods, fixing each of the housing segments to the rear edge portion of a respective one of the first and second housings comprises disposing a layer of polymeric material on the housing segment such that the layer of polymeric material is disposed between the bracket and the upper surface of the flexible printed circuit in the housing segment. In some methods, each of the housing segments is fixed to a respective one of the first and second housings when the first and second housings are in the closed state.

In some embodiments, each of the free segments of the flexible printed circuit connects a respective one of the housing segments to the cover segment. In some systems, each of the free segments is movable relative to the hinge cover and to the first and second housings when the first and second housings pivot between the open and closed states. Each of the free segments, in some systems, underlies the inner surface of the hinge cover when the first and second housings are in the open state. In some methods when the hinge cover is coupled to the first and second housings and the housing segments are each fixed to the rear edge portion of a respective one of the first and second housings, each of the free segments is movable relative to the hinge cover and to the first and second housings when the first and second housings pivot between the open and closed states and underlies the inner surface of the hinge cover when the first and second housings are in the open state.

In some embodiments, each of the free segments includes first and second parts, the first part connecting the second part to the cover segment. In some embodiments, when the first and second housings are in the open state, the upper surface of the flexible printed circuit is convex and subtends an angle that is greater than 90° in the first part of the free segment and is concave and subtends an angle that is greater than 90° in the second part of the free segment. Some methods comprise shaping the flexible printed circuit such that the upper surface of the flexible printed circuit. In some embodiments, for each of the free segments, in each of the first and second parts of the free segment, the angle that the upper surface of the flexible printed circuit subtends when the first and second housings are in the open state is larger than an angle that the upper surface of the flexible printed circuit subtends when the first and second housings are in the closed state. Some methods comprise shaping the flexible printed circuit such that the upper surface of the flexible printed circuit in the first part of each of the free segments is convex; in some of such methods, the upper surface of the flexible printed circuit in the cover segment is fixed to the inner surface of the hinge cover after the shaping. In some embodiments, each of the free segments is helical.

In some embodiments, in each of the free segments the upper and lower surfaces of the flexible printed circuit are each perforated.

Some systems comprise a battery is disposed in the first housing and a motherboard is disposed in the second housing. In some of such systems, the battery is electrically coupled to the motherboard via the flexible printed circuit.

Some systems comprise a video display. The video display, in some systems, is flexible. In some systems, the video display extends between the first and second housings.

The term "coupled" is defined as connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified—and includes what is specified; e.g., substantially 90 degrees includes 90 degrees and substantially parallel includes parallel—as understood by a person of ordinary skill in the art. In any disclosed embodiment, the term "about" may be substituted with "within [a percentage] of" what is specified, where the percentage includes 0.1, 1, 5, and 10 percent.

The terms "comprise" and any form thereof such as "comprises" and "comprising," "have" and any form thereof such as "has" and "having," and "include" and any form thereof such as "includes" and "including" are open-ended linking verbs. As a result, a product or system that "comprises," "has," or "includes" one or more elements possesses those one or more elements but is not limited to possessing only those elements. Likewise, a method that "comprises," "has," or "includes" one or more steps possesses those one or more steps but is not limited to possessing only those one or more steps.

Any embodiment of any of the products, systems, and methods can consist of or consist essentially of—rather than comprise/have/include—any of the described steps, elements, and/or features. Thus, in any of the claims, the term "consisting of" or "consisting essentially of" can be substituted for any of the open-ended linking verbs recited above in order to change the scope of a given claim from what it would otherwise be using the open-ended linking verb.

Further, a device or system that is configured in a certain way is configured in at least that way, but it can also be configured in other ways than those specifically described.

The feature or features of one embodiment may be applied to other embodiments, even though not described or illustrated, unless expressly prohibited by this disclosure or the nature of the embodiments.

Some details associated with the embodiments described above and others are described below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers.

DETAILED DESCRIPTION

Figure 1A:
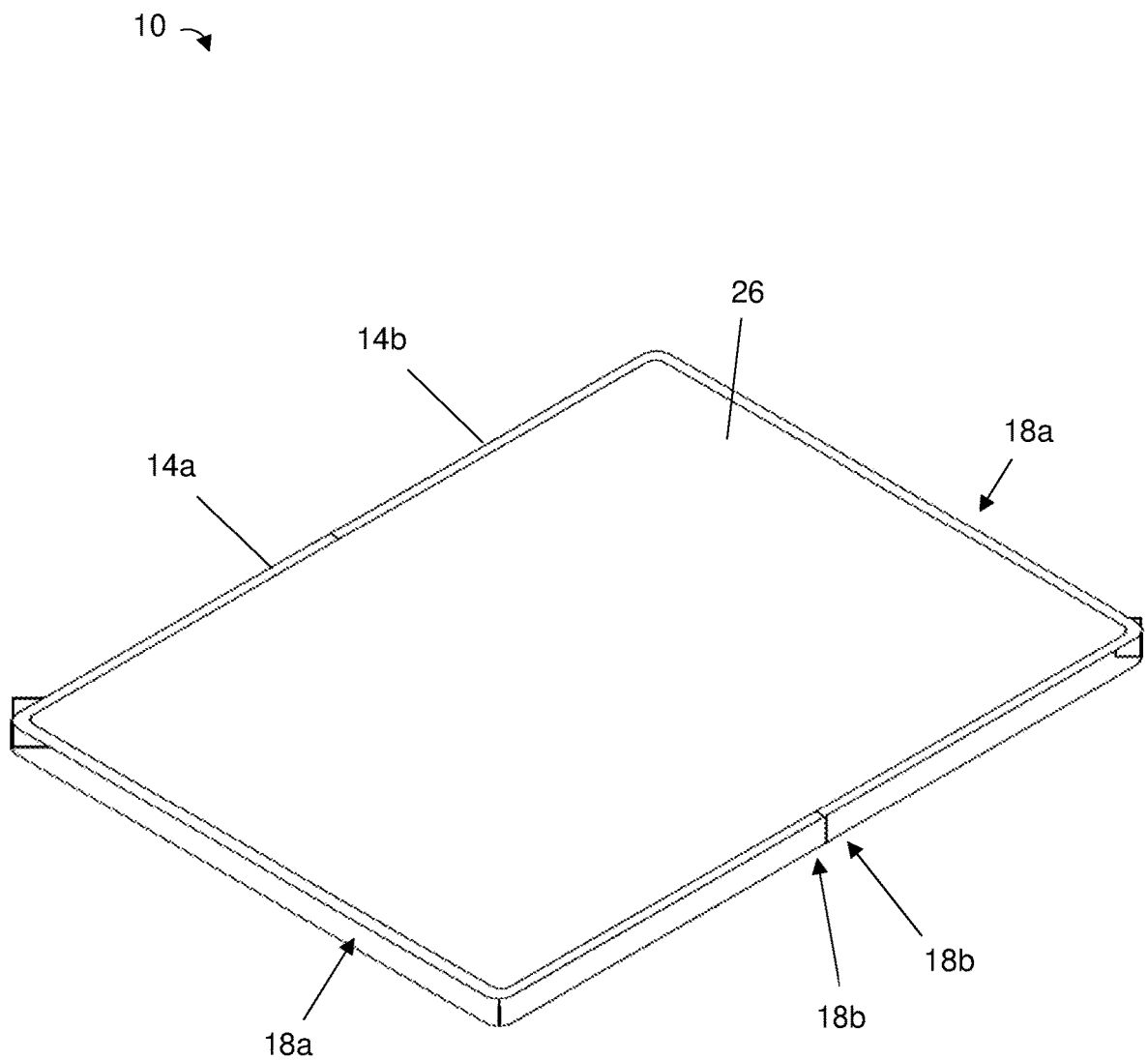
FIGS. 1A-1C are perspective, top, and bottoms views, respectively, of a first embodiment of the present information handling systems that is a tablet computer; as shown, the first and second housings of the information handling system are in an open state.
Figure 1B:
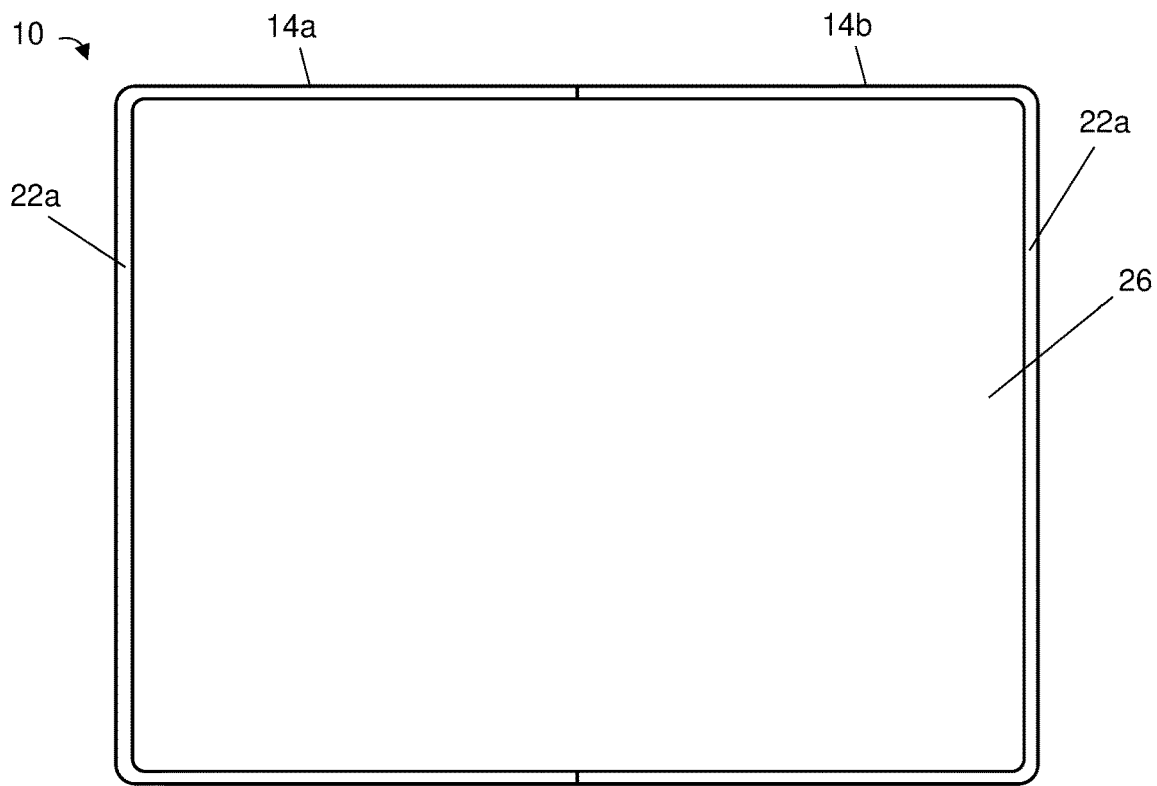
Figure 1C:
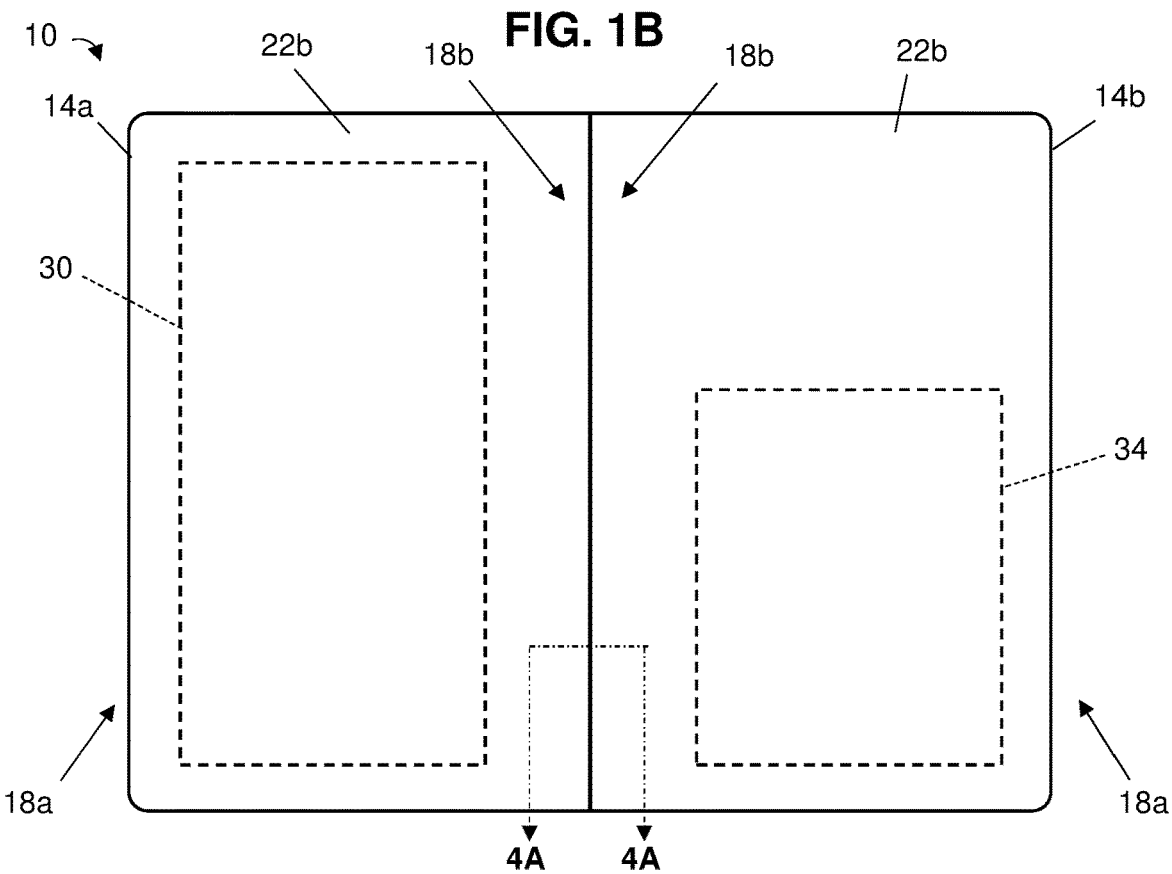

Referring to FIGS. 1A-1C, shown is one of the present information handling systems 10. Information handling system 10 may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific control, or other purposes. For example, information handling system 10 can be a personal computer (e.g., a laptop), a tablet computer, a mobile device (e.g., personal digital assistant (PDA) or smart phone), or any other suitable device and may vary in size, shape, performance, functionality, and price.

Information handling system 10 can comprise first and second housings 14a and 14b that can contain and support the information handling system's other components. For example, information handling system 10 can include a battery 30 and a motherboard 34 disposed in at least one of first and second housings 14a and 14b; as shown, the battery is disposed in the first housing and the motherboard is disposed in the second housing. Furthermore, information handling system 10 can include (e.g., in at least one of its housings 14a and 14b) random access memory (RAM), one or more processors such as a central processing unit (CPU), ROM, and/or other types of nonvolatile memory (which can be components on motherboard 34). Additional components of information handling system 10 that can be coupled to first and second housings 14a and 14b may include a video display 26, one or more disk drives, one or more network ports for communicating with external devices, and/or one or more input and output (I/O) devices such as a keyboard, a mouse, a touchpad, and/or a touchscreen (which can be the video display).

Figure 9:
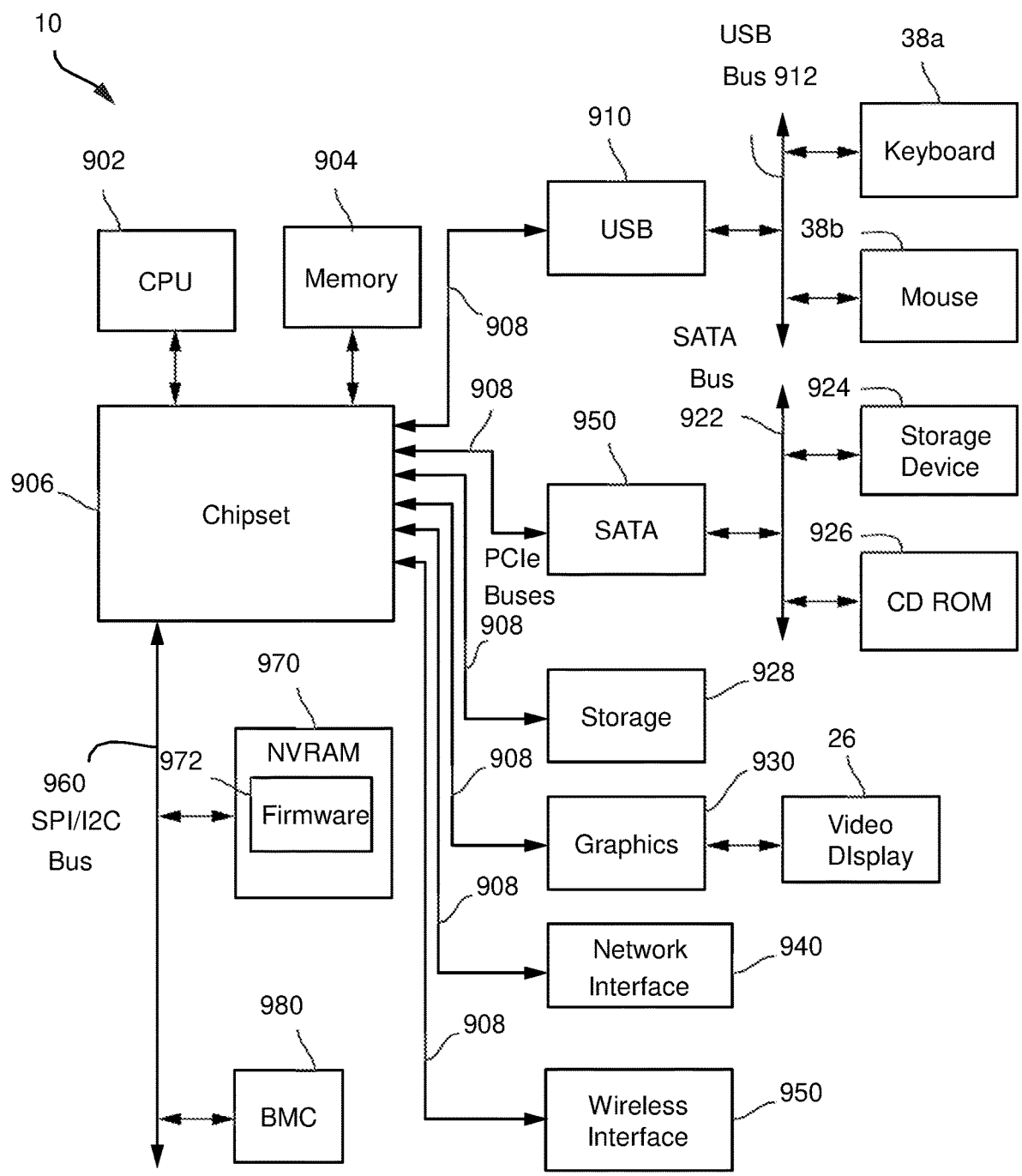
FIG. 9 is a schematic block diagram of one of the present information handling systems.

Information handling system 10 may also include one or more buses operable to transmit communications between the various hardware components (e.g., to electrically couple the components), and battery 30 can be electrically coupled to the hardware components like motherboard 34 (and thus to the components electrically coupled to the motherboard, like processor(s), memory, and/or video display 26) so that the battery can provide power to the hardware components; one example configuration of the information handling system is described in further detail with reference to FIG. 9. At least some of this electrical coupling can be across first and second housings 14a and 14b, e.g., with one or more components like battery 30 that are in the first housing electrically coupled to one or more components like motherboard 34 that are in the second housing. Such electrical coupling across housings 14a and 14b can be achieved with a flexible printed circuit 50 that extends across the housings as described in further detail below.

In the embodiment shown, information handling system 10 is a tablet computer. An information handling system 10 that is a tablet computer or a mobile device like a smart phone need not include I/O devices like a keyboard, touchpad, or mouse, and can comprise a video display 26 that is a touchscreen and, optionally, one or more buttons coupled to housings 14a and 14b for user inputs. With such a configuration, video display 26 preferably defines a large portion of information handling system 10's user-facing surface; as shown, the video display extends between (and thus is coupled to both) first and second housings 14a and 14b such that the video display overlies greater than or equal to any one of, or between any two of, 50%, 60%, 70%, 80%, or 90% of the planform of each of the housings.

Figure 2:
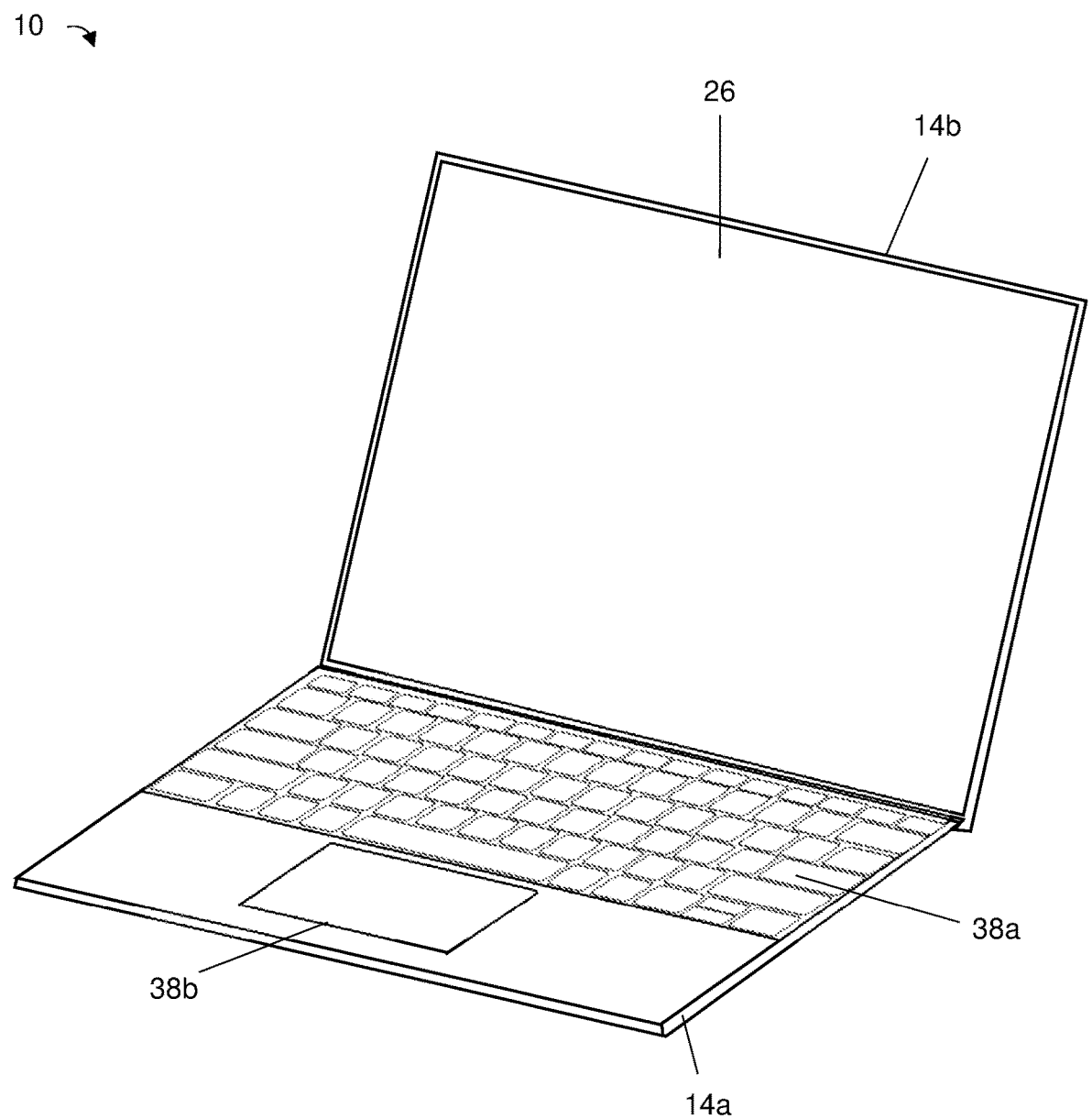
FIG. 2 is a perspective view of a second embodiment of one of the present information handling systems that is a laptop.

Referring to FIG. 2, in some information handling systems video display 26 need not extend between first and second housings 14a and 14b. For example, in the embodiment shown in FIG. 2, information handling system 10 is a laptop whose video display 26 is coupled to second housing 14b and whose first housing 14a houses other components of the laptop such as one or more processors, a motherboard (e.g., to which the processor(s) are coupled), one or more user-input devices like keyboard 38a and touchpad 38b, one or more cooling fans, and/or the like.

Figure 3A:
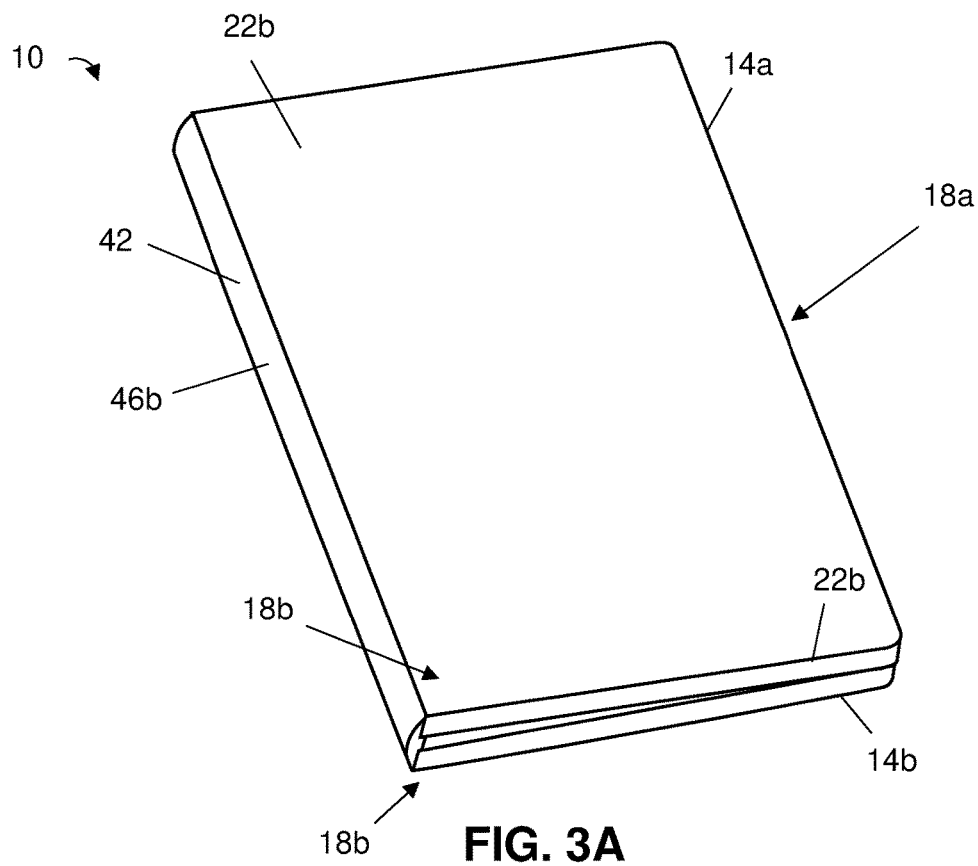
FIGS. 3A-3C are perspective, top, and side views, respectively, of the information handling system of FIG. 1A when the first and second housings of the information handling system are in the closed state.
Figure 3B:
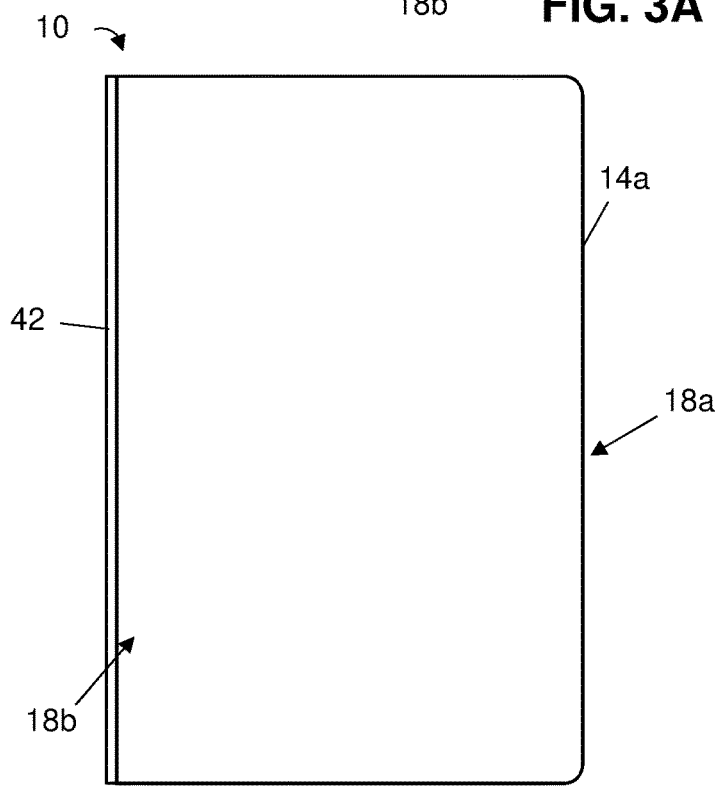
Figure 3C:
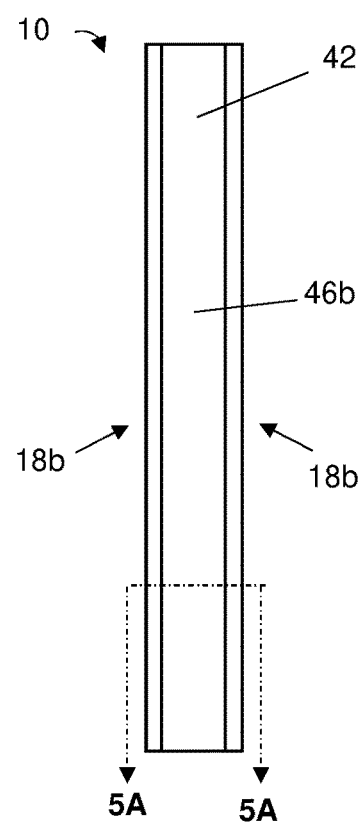
Figure 4A:
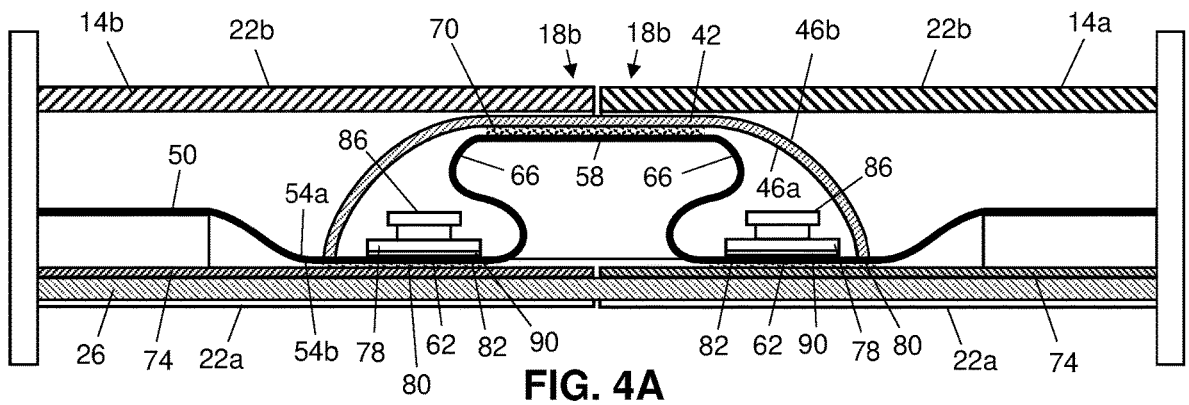
FIG. 4A is a partial sectional view of the information handling system of FIG. 1A taken along line 4A-4A of FIG. 1C and illustrates the routing of the information handling system's flexible printed circuit when the first and second housings are in the open state.
Figure 4B:
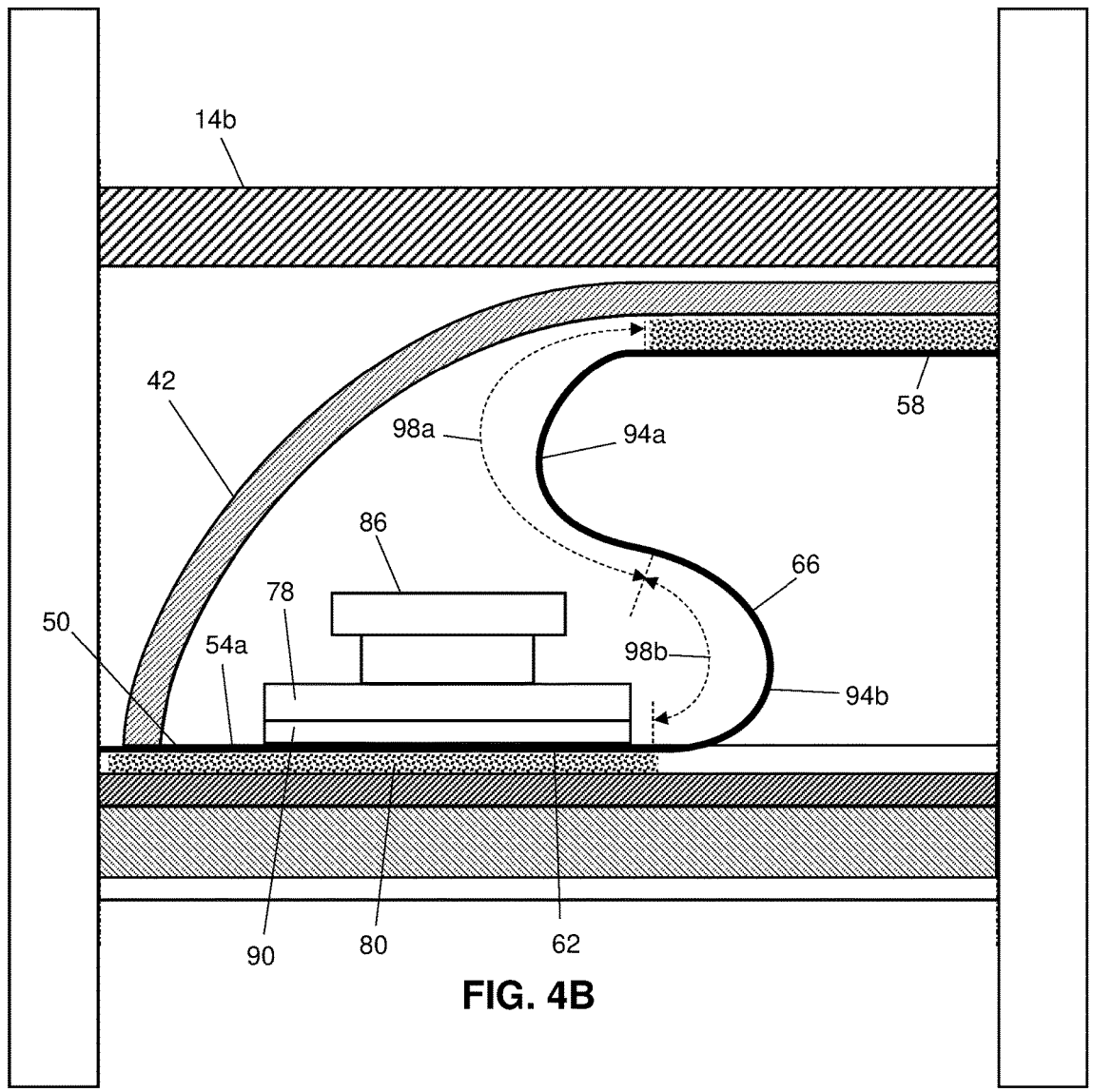
FIG. 4B is an enlarged partial sectional view of the information handling system of FIG. 1A and illustrates the curved geometry of the flexible printed circuit's free segments when the first and second housings are in the open state.

Referring additionally to FIGS. 3A-3C, regardless of information handling 10's type (e.g., tablet computer, mobile device, and/or the like), first and second housings 14a and 14b can be pivotally coupled to one another so that the information handling system is foldable. As shown, first and second housings 14a and 14b can each have opposing front and rear edge portions 18a and 18b, where the second housing's rear edge portion is pivotally coupled to the first housing's rear edge portion (e.g., with one or more hinges) and a hinge cover 42 extends along at least a portion (e.g., at least a majority, up to and including substantially all) of the rear edge portion of each of the housings (e.g., to overlie the hinge(s)). With such a coupling, first and second housings 14a and 14b can be pivotable between an open state (FIGS. 1A-1C and FIG. 2) and a closed state (FIGS. 3A-3C).

When first and second housings 14a and 14b are in the open state (FIGS. 1A-1C and FIG. 2), video display 26 and/or one or more I/O device(s) of information handling system 10 can be readily viewable and accessible for use. For example, first and second housings 14a and 14b can be pivotable to at least an open state in which a front face 22a (and, optionally, an opposing rear face 22b) of the first housing is substantially parallel with a front face 22a (and, optionally, an opposing rear face 22b) of the second housing. When video display 26 extends between first and second housings 14a and 14b as described above with reference to FIGS. 1A-1C, such openability can permit the video display—which can be flexible (e.g., a flexible organic light-emitting diode (OLED) display such as a plastic OLED (POLED) display)—to be fully extended, optionally such that the video display is planar.

When first and second housings 14a and 14b are in the closed state (FIGS. 3A-3C), information handling system 10 can have a smaller form factor for storage and transport and the housings can protect other components of the information handling system that might otherwise be susceptible to damage (e.g., video display 26). For example, when first and second housings 14a and 14b are pivoted to the closed state, the second housing's front edge portion 18a can be disposed closer to the first housing's front edge portion 18a than when the first and second housings are in the open state, optionally with the front edge portions of the housings touching one another. In this manner, a length of information handling system 10 when first and second housings 14a and 14b are in the closed state can be smaller than (e.g., about half of) the information handling system's length when the housings are in the open state. Furthermore, this closing can be carried out such that first housing 14a's front face 22a faces second housing 14b's front face 22a, while the housings' rear faces 22b face away from one another and hinge cover 42 occupies the gap between the housings' rear edge portions 18b. Display 26, which can be coupled to first housing 14a's front face 22a and/or second housing 14b's front face 22a, can thus be protected from any abrasions and impacts that would instead be imparted on the outwardly-facing rear faces 22b of the housings and/or the outwardly-facing outer surface 46b of hinge cover 42.

Referring additionally to FIGS. 4A, 4B, 5A, and 5B and as described above, information handling system 10 can comprise a flexible printed circuit 50 that extends between first and second housings 14a and 14b to electrically couple components (e.g., battery 30 and motherboard 34) that are disposed in different housings. Flexible printed circuit 50 can have one or more electrical conductors (that can comprise, for example, copper) coupled to one or more flexible films (e.g., one or more polymeric films that can comprise, for example, polyimide, polyether ether ketone (PEEK), and/or polyester) to achieve the requisite electrical coupling. For example, flexible printed circuit 50 can have opposing upper and lower surfaces 54a and 54b, where at least a portion (up to and including substantially all) of at least one, optionally each, of the surfaces is defined by an electrically-conductive layer (e.g., a metallic layer that can comprise, for example, copper) coupled to one of the flexible film(s) to serve as a ground plane. Flexible printed circuit 50 can also comprise one or more interior electrically-conductive layer(s) (e.g., that do not define either of the flexible printed circuit's upper and lower surfaces 54a and 54b) and/or one or more electrically-conductive traces.

Figure 5A:
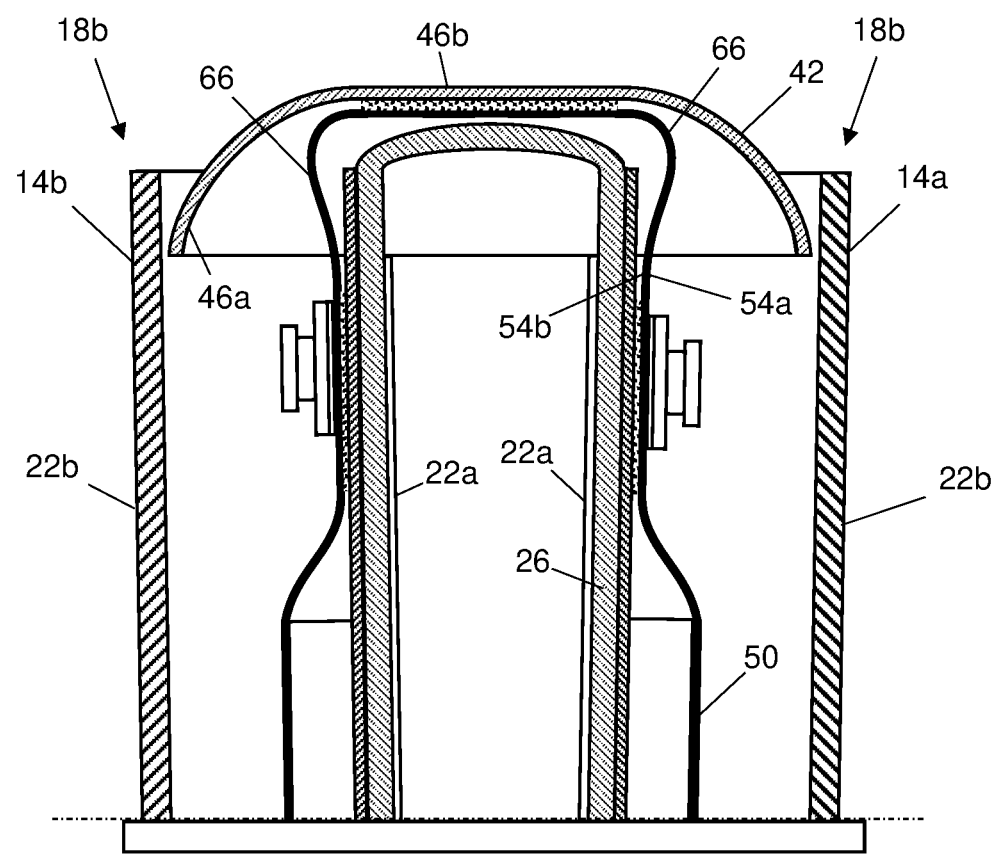
FIG. 5A is a partial sectional view of the information handling system of FIG. 1A taken along line 5A-5A of FIG. 3C and illustrates the routing of the information handling system's flexible printed circuit when the first and second housings are in the closed state.
Figure 5B:
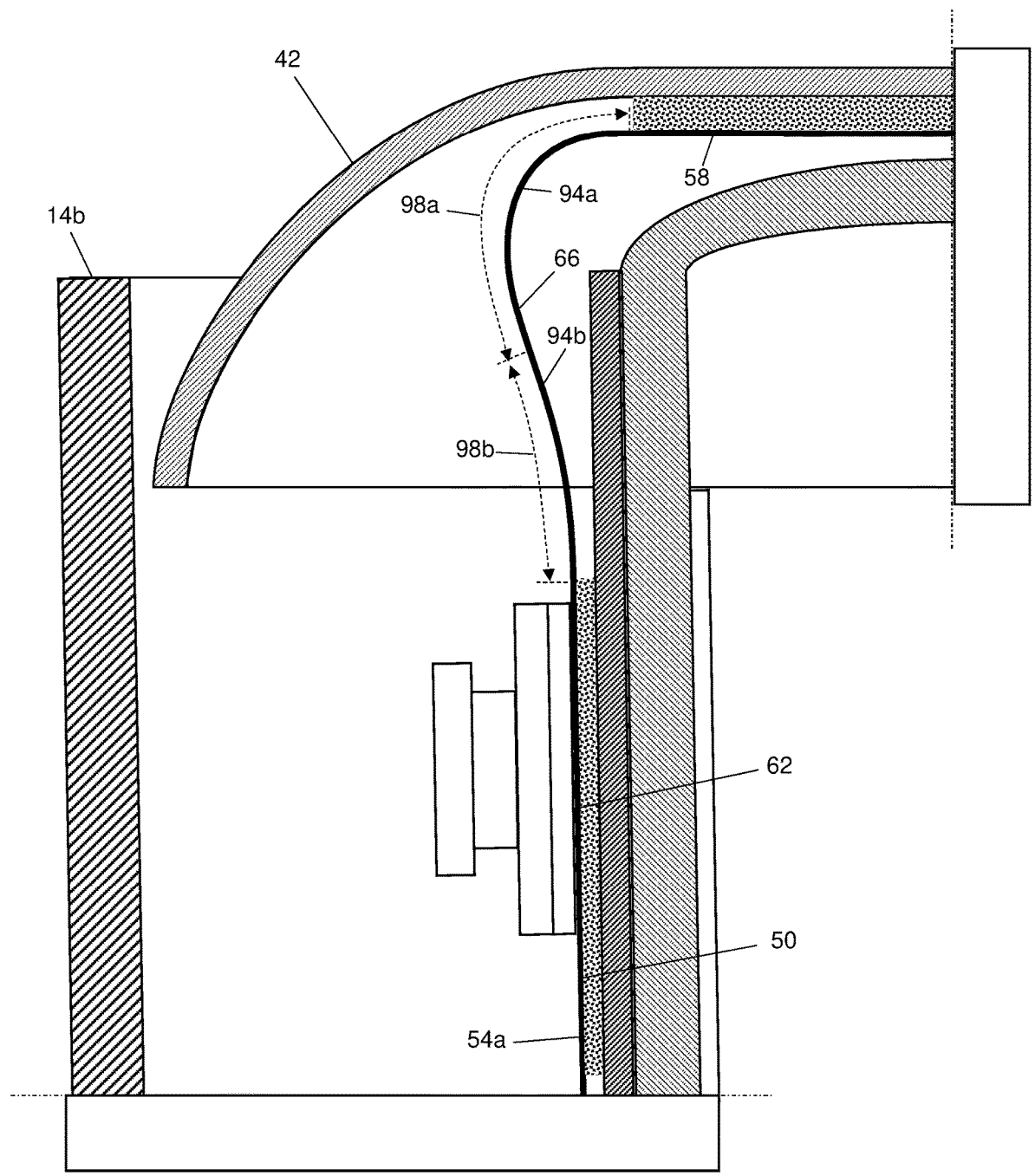
FIG. 5B is an enlarged partial sectional view of the information handling system of FIG. 1A and illustrates how the free segments of the flexible printed circuit extend out of the FIGS. 4A-4B curved geometry when the first and second housings pivot to the closed state.

Because flexible printed circuit 50 extends between first and second housings 14a and 14b, the pivoting of the housings between the open and closed states can change the distance between the ends of the flexible printed circuit (which can each be fixed relative to a respective one of the housings) and thus impart movement on the flexible printed circuit. Flexible printed circuit 50 can be shaped and arranged to permit the required movement and mitigate wear on the flexible printed circuit when housings 14a and 14b pivot. To do so, flexible printed circuit 50 can include a cover segment 58, two housings segments 62, and two free segments 66 that each connect a respective one of the housing segments to the cover segment. In cover segment 58, flexible printed circuit 50's upper surface 54a can be fixed to hinge cover 42's inner surface 46a that is opposite to the hinge cover's outer surface 46b, while each of housing segments 62 (e.g., lower surface 54b of the flexible printed circuit in each housing segment) can be fixed to rear edge portion 18b of a respective one of first and second housings 14a and 14b. Free segments 66 need not be fixed to first and second housings 14a and 14b or hinge cover 42 and can be sufficiently long to have slack when the housings are in the open state, thereby allowing the free segments to be movable relative to the hinge cover and to the housings when the housings pivot between the open state (FIGS. 4A and 4B) and the closed state (FIGS. 5A and 5B). Furthermore, while free segments 66 can be sufficiently long to accommodate movement of flexible printed circuit 50 when first and second housings 14a and 14b pivot between the open and closed states, the free segments can also be sufficiently compact such that they can underlie hinge cover 42's inner surface 46a when the housings are in the open state (and, optionally, when the housings are in the closed state). Maintaining free segments 66 under hinge cover 42 can save cable-routing space in housings 14a and 14b, and their compactness can facilitate material, and thus cost, savings in the production of flexible printed circuit 50.

The geometry of free segments 66 can facilitate their compactness and mitigate wear on flexible printed circuit 50 when first and second housings 14a and 14b move between the open and closed states. For example, each of free segments 66 can have first and second parts 94a and 94b, where the first part connects the second part to cover segment 58 and the second part connects the first part to housing segment 62. For each of free segments 66, when first and second housings 14a and 14b are in the open state, upper surface 54a of flexible printed circuit 50 can be convex and subtend an angle 98a that is greater than or equal to any one of, or between any two of, 90°, 100°, 110°, 120°, 130°, 140°, 150°, 160°, or 170° (e.g., between 130° and 170°) in first part 94a and can be concave and subtend an angle 98b that is greater than or equal to any one of, or between any two of, 90°, 100°, 110°, 120°, 130°, 140°, 150°, 160°, or 170° (e.g., between 130° and 170°, or about the same as angle 98a) in second part 94b (FIG. 4B), optionally such that the flexible printed circuit's upper surface in cover portion 58 is substantially parallel to its upper surface in housing segments 62. When first and second housings 14a and 14b are pivoted to the closed state, each of free segments 66 can at least partially extend out of this curved geometry, e.g., such that angles 98a and 98b that flexible printed circuit 50's upper surface 54a subtends in first and second parts 94a and 94b, respectively, are each larger when the housings are in the open state (FIG. 4B) than when the housings are in the closed state (FIG. 5B). The extension from this geometry can yield the movement required to permit first and second housings 14a and 14b to pivot with less stress exerted on flexible printed circuit 50, relative to conventional designs, thereby improving the longevity of the flexible printed circuit with repeated pivoting between the open and closed states.

Flexible printed circuit 50's cover segment 58 and housing segments 62 can be fixed to hinge cover 42 and housings 14a and 14b, respectively, in a manner that both maintains the integrity of the flexible printed circuit and grounds one or more electrical conductors of the flexible printed circuit to promote its electrical-coupling function. For example, when upper surface 54a (and, optionally, lower surface 54b) of flexible printed circuit 50 (or at least the portion thereof in cover segment 58) is defined by an electrically-conductive layer that serves as a ground plane, inner surface 46a of hinge cover 42 can comprise an electrically-conductive material (e.g., copper, aluminum, and/or the like) and the flexible printed circuit's upper surface in the cover segment can be fixed to the hinge cover's inner surface at least with an electrically-conductive adhesive 70 to facilitate grounding of the electrically-conductive layer. Because cover segment 58 may be subject to relatively low forces when first and second housings 14a and 14b pivot, electrically-conductive adhesive 70 can alone be sufficient to hold the cover segment to hinge cover 42.

Furthermore, each of first and second housings 14a and 14b can comprise a metallic layer 74 that can structurally support and provide grounding for one or more components of information handling system 10; each of housing segments 62 of flexible printed circuit 50 can be fixed to a respective one of the housings such that an electrically-conductive layer of the flexible printed circuit (e.g., one defining lower surface 54b, or at least a portion thereof in the housing segment) is grounded to the metallic layer of the housing. As shown, for example, in each of housing segments 62 lower surface 54b of flexible printed circuit 50 is fixed to metallic layer 74 at least with an electrically-conductive adhesive 80 that is disposed between the metallic layer and the lower surface. Because housing segments 62 may be subject to higher forces than is cover segment 58 when first and second housings 14a and 14b pivot between the open and closed states, information handling system 10 can include one or more additional components to fix the housing segments. As shown, for each of housing segments 62, a bracket 78 can overlie the housing segment and can be fastened to rear edge portion 18b (e.g., to metallic layer 74) with one or more fasteners 86 (e.g., one or more screws and/or bolts). Such fastening can also promote grounding of an electrically-conductive layer of flexible printed circuit 50 defining its lower surface 54b (and, optionally, an electrically-conductive layer of the flexible printed circuit defining its upper surface 54a) to metallic layer 74. To further support flexible printed circuit 50 in housing segments 62, information handling system can comprise, for each of the housing segments, a layer of material 90 (e.g., a polymeric layer) disposed between bracket 78 and upper surface 54a of the flexible printed circuit in the housing segment.

Figure 6A:
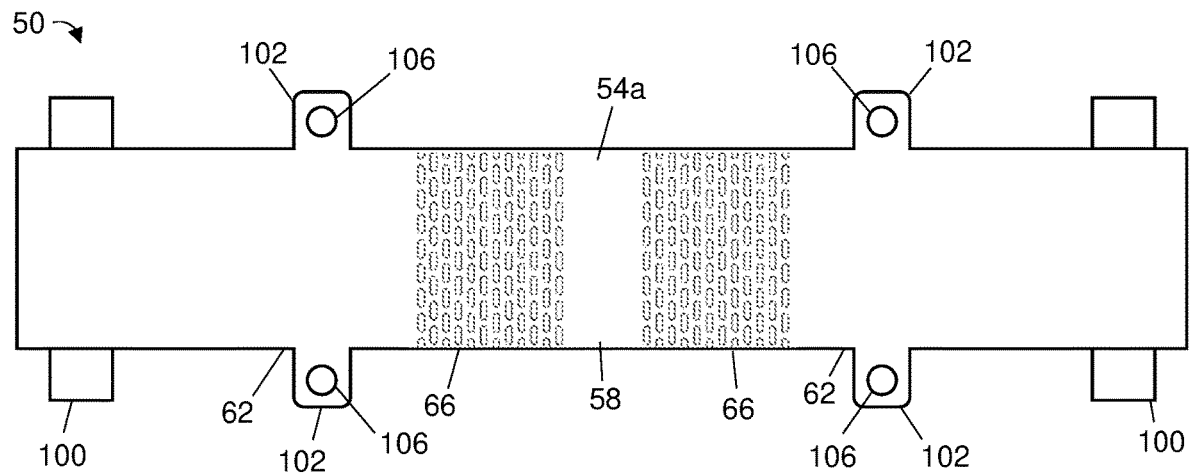
FIG. 6A is a top view of a flexible printed circuit that can be used in some of the present information handling systems.
Figure 6B:
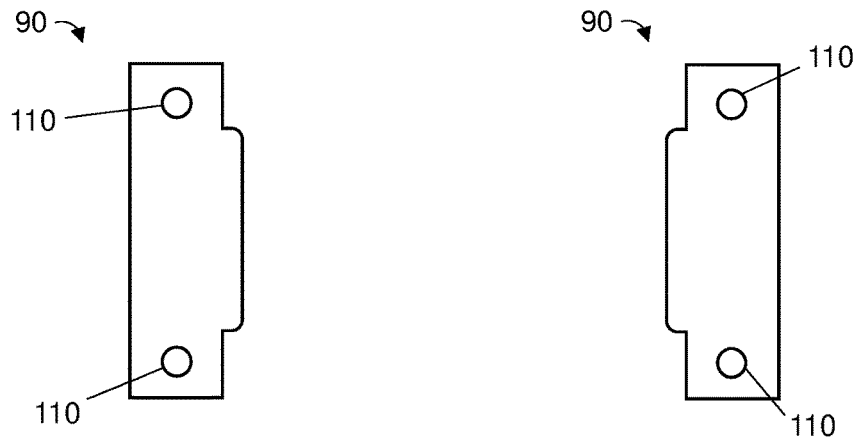
FIG. 6B is a top view of two layers of material that can each overlie a respective one of two housing segments of the flexible printed circuit when the housing segment is fixed to one of the information handling system's housings.
Figure 6C:
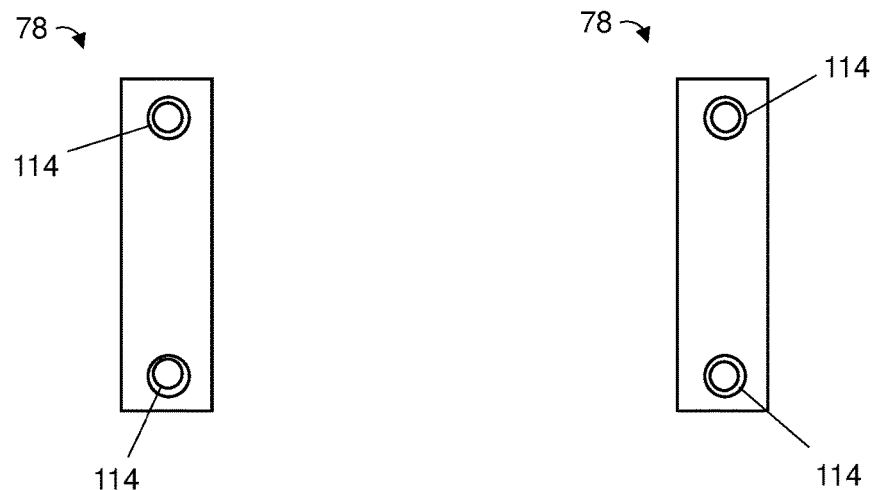
FIG. 6C is a top view of two brackets that can each be used to fix a respective one of the housing segments of the flexible printed circuit to one of the information handling system's housings.

Referring further to FIGS. 6A-6C, to facilitate coupling with brackets 78, flexible printed circuit 50 can have, in each of housing segments 62, one or more, optionally two or more, tabs 102 (e.g., at least one tab extending from a first edge of the flexible printed circuit and at least one tab extending from a second, opposing edge of the flexible printed circuit) that each define an opening 106. For each housing segment 62, bracket 78 that overlies the housing segment can define an opening 114 for each opening 106 of the housing segment's tab(s), and optional layer of material 90 can likewise define an opening 110 for each opening of the housing segment's tab(s). Accordingly, opening(s) 110 of bracket 78 and opening(s) of layer of material 90 can overlie opening(s) 106 of tab(s) 102 such that fastener(s) 86 can be disposed therethrough.

To promote flexibility in free segments 66 such that the free segments can readily move when housings 14a and 14b pivot between the open and closed states, in each of the free segments upper surface 54a and/or lower surface 54b of flexible printed circuit 50 can be perforated. Such perforation may be particularly advantageous when the perforated surface(s) each comprise an electrically-conductive layer comprising, for example, a metallic material like copper, as the material removal from the perforating removes otherwise-stiffening portions of the metallic material.

Flexible printed circuit 50 can have any suitable mechanism for interfacing with components that it electrically couples; for example, as shown, the flexible printed circuit includes a connector 100 at each of its ends. One of connectors 100 can be coupled to, for example, battery 30 and the other of the connectors can be coupled to, for example, motherboard 34.

Referring to FIGS. 7A-7D, illustrated are some of the present methods of making an information handling system (e.g., 10) that comprises a flexible printed circuit (e.g., 50) having a cover segment (e.g., 58), two housing segments (e.g., 62), and two free segments (e.g., 66) as described above. Each of the free segments can have first and second parts (e.g., 94a and 94b), the first part connecting the second part to the cover segment and the second part connecting the first part to one of the housing segments. As shown, some methods comprise a step of shaping the flexible printed circuit (e.g., using a jig) such that an upper surface (e.g., 54a) of the flexible printed circuit is convex in the first part of each of the free segments (FIG. 7A), optionally such that the upper surface subtends an angle that is greater than or equal to any one of, or between any two of, 60°, 70°, 80°, 90°, 100°, or 110° (e.g., at least 90°) in the first part. This shaping can help the flexible printed circuit assume the above-described advantageous geometry in its free segments when the information handling system is assembled, e.g., with the upper surface of the flexible printed circuit being convex in the first part of the free segment and concave in the second part of the free segment when first and second housings (e.g., 14a and 14b) of the information handling system are in an open state. Additionally, the shaping of the flexible printed circuit can facilitate handling thereof during assembly.

Figure 7A:
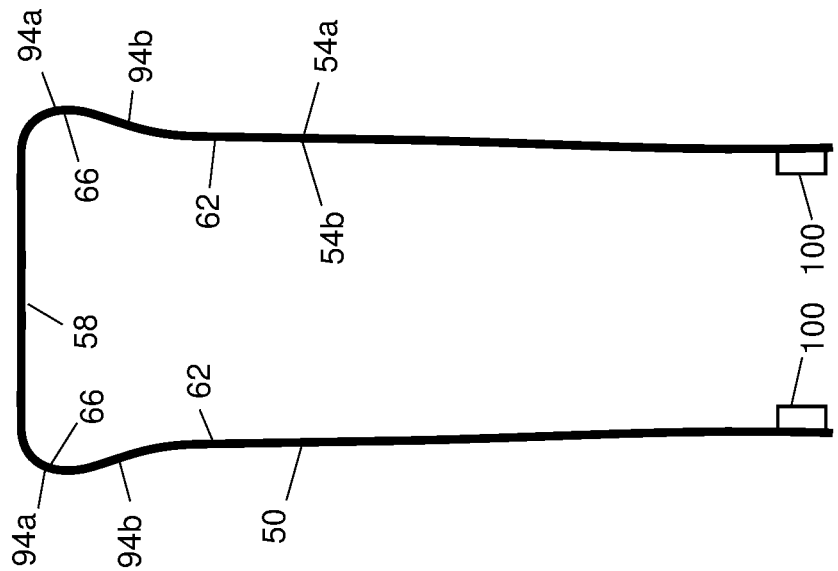
FIG. 7A illustrates a step of some of the present methods that includes shaping the flexible printed circuit during assembly of the information handling system.
Figure 7B:
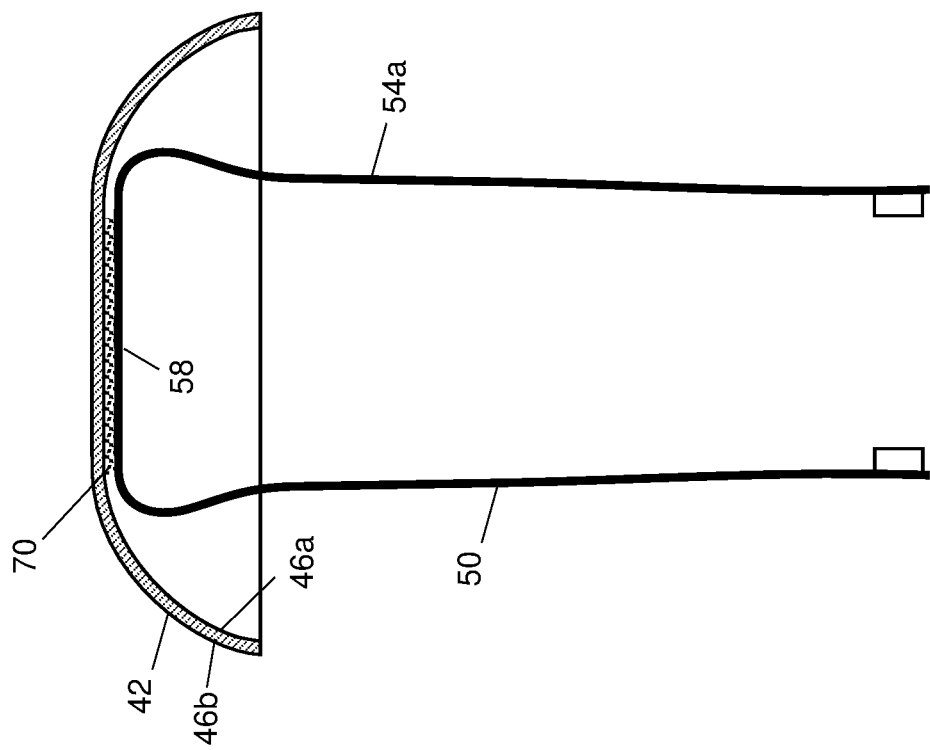
FIG. 7B illustrates a step of some of the present methods that includes fixing the upper surface of the flexible printed circuit in a cover segment of the flexible printed circuit to an inner surface of a hinge cover.

Some methods comprise a step of fixing the upper surface of the flexible printed circuit in the cover segment to an inner surface (e.g., 46a) of a hinge cover (e.g., 42) (FIG. 7B). Fixing the flexible printed circuit's upper surface to the hinge cover's inner surface can be performed after the flexible printed circuit is shaped and can be performed in any suitable manner. For example, the fixing can comprise adhering the upper surface of the flexible printed circuit in the cover segment to the inner surface of the hinge cover with an electrically-conductive adhesive (e.g., 70), which as described above can facilitate grounding of an electrically-conductive layer of the flexible printed circuit when the hinge cover's inner surface comprises an electrically-conductive material.

Figure 7C:
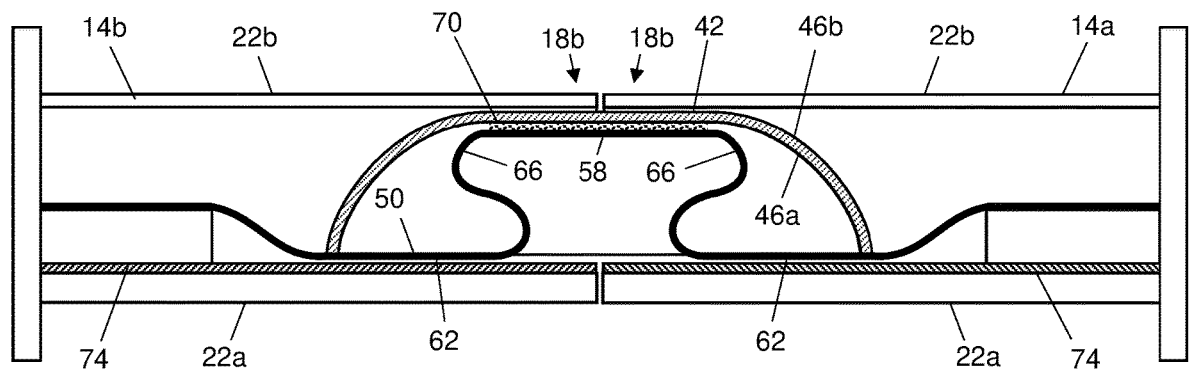
FIG. 7C illustrates a step of some of the present methods that includes coupling the hinge cover to the first and second housings of the information handling system after the flexible printed circuit's upper surface in the cover segment is fixed to the hinge cover's inner surface.

Some methods comprise, while the upper surface of the flexible printed circuit in the cover segment is fixed to the inner surface of the hinge cover, coupling the hinge cover to the first and second housings that, as described above, each have opposing front and rear edge portions (e.g., 18a and 18b) where the first housing's rear edge portion is pivotally coupled to the second housing's rear edge portion such that the housings are pivotable between the above-described open and closed states (FIG. 7C). The hinge cover can be coupled to the first and second housings such that the hinge cover extends along at least a portion (e.g., at least a majority, up to and including substantially all) of the rear edge portion of each of the housings. When the hinge cover is coupled to the first and second housings, the housings can be in the open state.

Figure 7D:
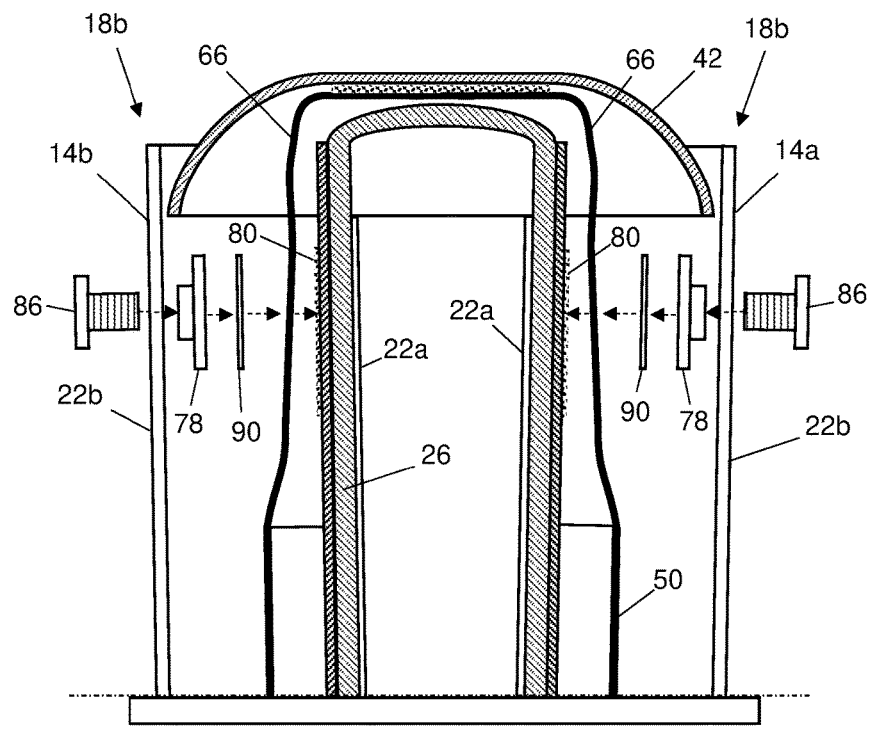
FIG. 7D illustrates a step of some of the present methods that includes fixing the housing segments of the flexible printed circuit to the rear edge portions of the first and second housings.

Some methods comprise a step of fixing each of the housing segments of the flexible printed circuit to the rear edge portion of a respective one of the first and second housings (FIG. 7D). To facilitate this, the fixing can be performed when the first and second housings are in the closed state. As described above, the housing segments can be fixed to the rear edge portions of the housings using an electrically-conductive adhesive (e.g., 80) and/or brackets (e.g., 78) to facilitate grounding; for each housing segment, the fixing can comprise adhering a lower surface (e.g., 54b) of the flexible printed circuit that opposes the flexible printed circuit's upper surface to a metallic layer (e.g., 74) of the housing with the electrically-conductive adhesive and fastening the bracket to the metallic layer (e.g., with one or more fasteners 86) such that the bracket overlies the housing segment. The fixing can also comprise disposing a layer of material (e.g., 90), such as a layer of polymeric material, on each of the housing segments such that the layer of material is disposed between the bracket and the flexible printed circuit's upper surface in the housing segment, which can provide support for the flexible printed circuit. In other embodiments, however, the fixing can comprise, for each of the housing segments, adhering the bracket to the housing segment (e.g., to the housing segment's upper surface) with an electrically-conductive adhesive and then fastening the bracket to the metallic layer (e.g., to complete the grounding); this approach can facilitate assembly but may not provide as strong of a ground as that achievable when adhering the housing segment to the metallic layer. As shown, the fixing of the housing segments can be performed after the hinge cover and, optionally, a video display (e.g., 26) are coupled to the housings.

Figure 8A:
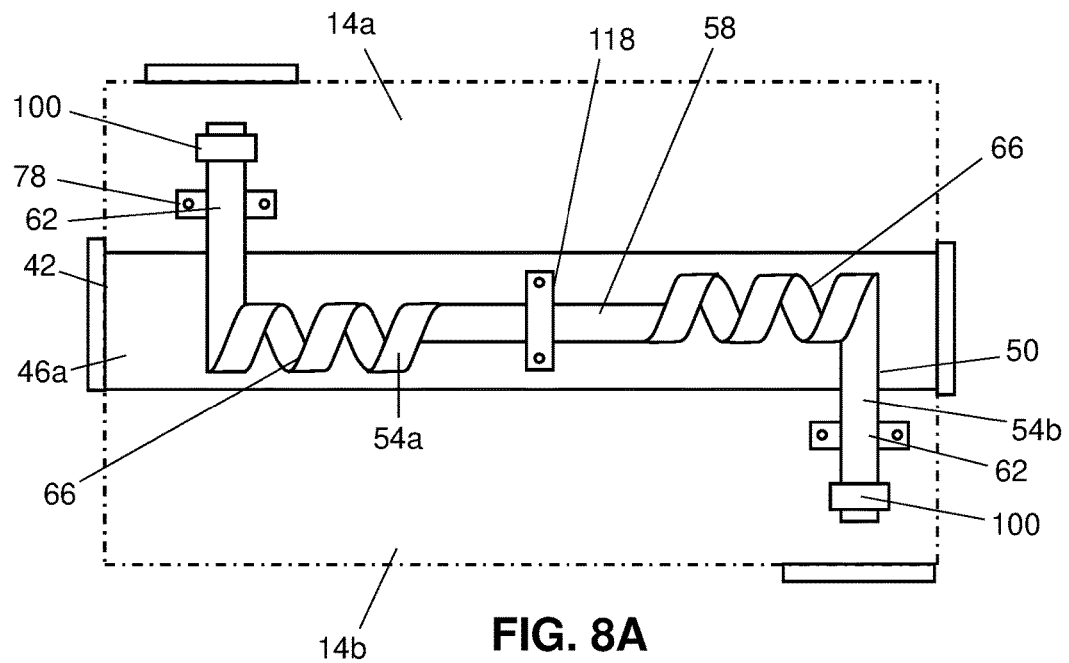
FIGS. 8A and 8B illustrate third and fourth embodiments of the present information handling systems in which the free segments of the flexible printed circuit are helical.
Figure 8B:
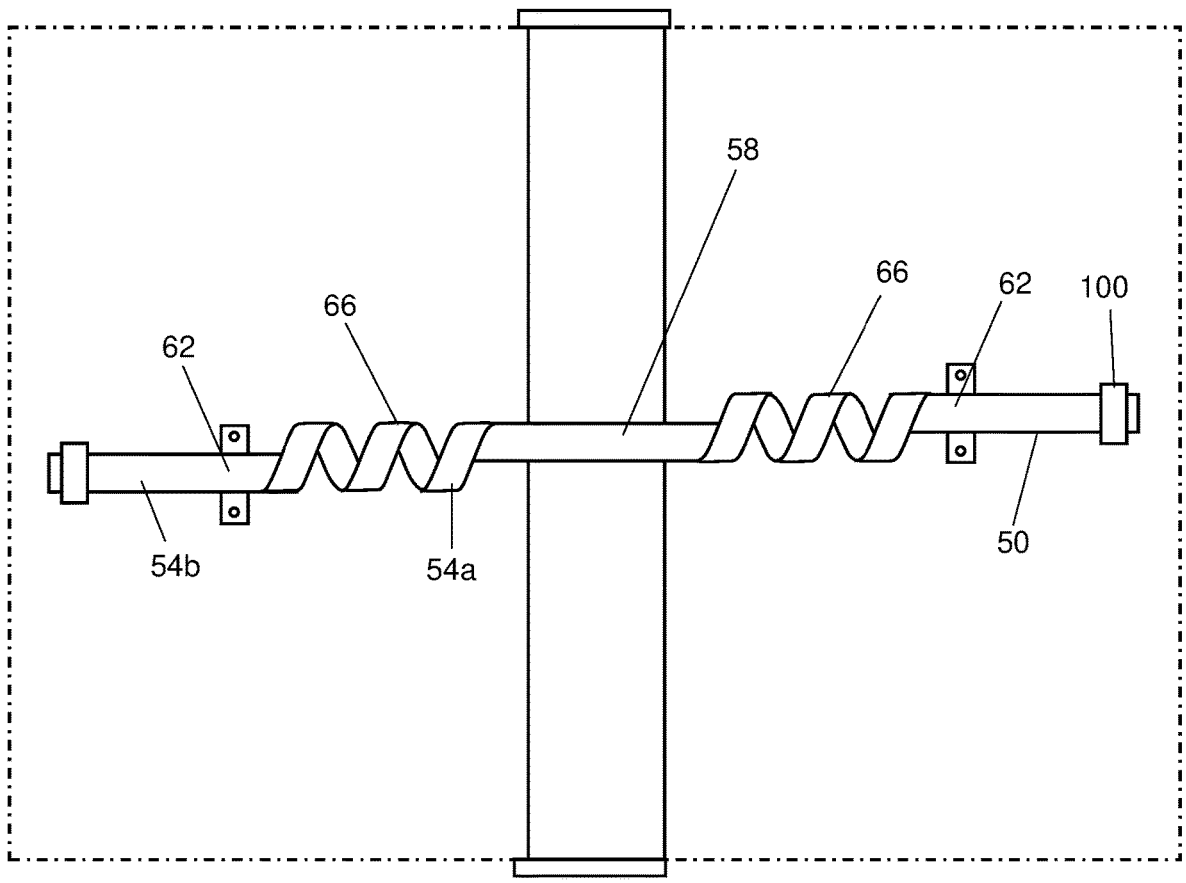

Referring to FIGS. 8A and 8B, shown are alternative geometries of flexible printed circuit 50 that allow the requisite movement when first and second housings 14a and 14b pivot between the open and closed states. As for the systems described above, in the embodiments shown flexible printed circuit 50 can include a cover segment 58 in which the flexible printed circuit's upper surface 54a is fixed to inner surface 46a of hinge cover 42, two housing segments 62 that are each fixed to a respective one of first and second housings 14a and 14b, and two free segments 66 that are each movable relative to the hinge cover and to the first and second housings when the housings pivot between the open and closed states and each connect a respective one of the housing segments to the cover segment. However, in the embodiments shown each of free segments 66 is helical, e.g., with the flexible printed circuit revolving about an axis greater than or equal to any one of, or between any two of, 2, 2.5, 3, 3.5, 4, 4.5, 5, or 5.5 times in each helical free segment. Such a helical geometry permits unwinding of flexible printed circuit 50 in free segments 66 to permit the requisite circuit movement when first and second housings 14a and 14b pivot from the open state to the closed state in a manner that, while not as space-efficient as the earlier-described geometry, mitigates wear on the flexible printed circuit. As shown, the revolving portion of each of helical free segments 66 can underlie inner surface 46a of cover segment 42 when housings 14a and 14b are in the open and closed states (e.g., with the axis the flexible printed circuit revolves around extending in a direction that is substantially parallel to an axis about which the housings pivot) (FIG. 8A), or can be contained in one of the housings (e.g., with the axis the flexible printed circuit revolves around extending in a direction that is substantially perpendicular to the axis about which the housings pivot) (FIG. 8B). As shown, cover segment 58 can, in addition or as an alternative to an electrically-conductive adhesive, be fixed to inner surface 46a of cover segment 42 using a bracket 118 that underlies the cover segment (FIG. 8A), which can provide extra support to flexible printed circuit 50 when helical free segments 66 are unwound; such support may be particularly advantageous with helical segments that underlie the cover segment.

Referring to FIG. 9, shown in further detail are components of an information handling system 10 that can comprise flexible printed circuit 50. Information handling system 10 may include a processor 902 (e.g., a central processing unit (CPU)), a memory (e.g., a dynamic random-access memory (DRAM)) 904, and a chipset 906. As described above, in some embodiments, one or more of processor 902, memory 904, and chipset 906 may be included on a motherboard (also referred to as a mainboard), which is a printed circuit board (PCB) with embedded conductors organized as transmission lines between the processor, the memory, the chipset, and/or other components of the information handling system. The components may be coupled to the motherboard through packaging connections such as a pin grid array (PGA), ball grid array (BGA), land grid array (LGA), surface-mount technology, and/or through-hole technology. In some embodiments, one or more of processor 902, memory 904, chipset 906, and/or other components may be organized as a System on Chip (SoC).

Processor 902 may execute program code by accessing instructions loaded into memory 904 from a storage device, executing the instructions to operate on data also loaded into the memory from a storage device, and generate output data that is stored back into the memory or sent to another component. Processor 902 may include processing cores capable of implementing any of a variety of instruction set architectures (ISAs), such as the x86, POWERPC®, ARM®, SPARC®, or MIPS® ISAs, or any other suitable ISA. In multi-processor systems, each of processors 902 may commonly, but not necessarily, implement the same ISA. In some embodiments, multiple processors may each have different configurations such as when multiple processors are present in a big-little hybrid configuration with some high-performance processing cores and some high-efficiency processing cores. Chipset 906 may facilitate the transfer of data between processor 902, memory 904, and other components. In some embodiments, chipset 906 may include two or more integrated circuits (ICs), such as a northbridge controller coupled to processor 902, memory 904, and a southbridge controller, with the southbridge controller coupled to the other components such as USB 910, SATA 920, and PCIe buses 908. Chipset 906 may couple to other components through one or more PCIe buses 908.

Some components may be coupled to one bus line of PCIe buses 908, whereas some components may be coupled to more than one bus line of PCIe buses 908. One example component is a universal serial bus (USB) controller 910, which interfaces chipset 906 to a USB bus 912. A USB bus 912 may couple input/output components such as a keyboard 38a and a mouse 38b, but also other components such as USB flash drives, or another information handling system. Another example component is a SATA bus controller 950, which couples chipset 906 to a SATA bus 922. SATA bus 922 may facilitate efficient transfer of data between chipset 906 and components coupled to the chipset and a storage device 924 (e.g., a hard disk drive (HDD) or solid-state disk drive (SDD)) and/or a compact disc read-only memory (CD-ROM) 926. PCIe bus 908 may also couple chipset 906 directly to a storage device 928 (e.g., a solid-state disk drive (SDD)). A further example of an example component is a graphics device 930 (e.g., a graphics processing unit (GPU)) for generating output to a video display 26, a network interface controller (NIC) 940, and/or a wireless interface 950 (e.g., a wireless local area network (WLAN) or wireless wide area network (WWAN) device) such as a Wi-Fi® network interface, a Bluetooth® network interface, a GSM® network interface, a 3G network interface, a 4G LTE® network interface, and/or a 5G NR network interface (including sub-6 GHZ and/or mmWave interfaces).

Chipset 906 may also be coupled to a serial peripheral interface (SPI) and/or Inter-Integrated Circuit (I2C) bus 960, which couples the chipset to system management components. For example, a non-volatile random-access memory (NVRAM) 970 for storing firmware 972 may be coupled to bus 960. As another example, a controller, such as a baseboard management controller (BMC) 980, may be coupled to the chipset 906 through bus 960. BMC 980 may be referred to as a service processor or embedded controller (EC). Capabilities and functions provided by BMC 980 may vary considerably based on the type of information handling system. For example, the term baseboard management system may be used to describe an embedded processor included at a server, while an embedded controller may be found in a consumer-level device. As disclosed herein, BMC 480 represents a processing device different from processor 902, which provides various management functions for information handling system 10. For example, an embedded controller may be responsible for power management, cooling management, and the like. An embedded controller included at a data storage system may be referred to as a storage enclosure processor or a chassis processor.

System 10 may include additional processors that are configured to provide localized or specific control functions, such as a battery management controller. Bus 960 can include one or more busses, including a Serial Peripheral Interface (SPI) bus, an Inter-Integrated Circuit (I2C) bus, a system management bus (SMBUS), a power management bus (PMBUS), or the like. BMC 980 may be configured to provide out-of-band access to devices at information handling system 10. Out-of-band access in the context of the bus 960 may refer to operations performed prior to execution of firmware 972 by processor 902 to initialize operation of system 10.

Firmware 972 may include instructions executable by processor 902 to initialize and test the hardware components of system 10. For example, the instructions may cause processor 902 to execute a power-on self-test (POST). The instructions may further cause processor 902 to load a boot loader or an operating system (OS) from a mass storage device. Firmware 972 additionally may provide an abstraction layer for the hardware, such as a consistent way for application programs and operating systems to interact with the keyboard, display, and other input/output devices. When power is first applied to information handling system 10, the system may begin a sequence of initialization procedures, such as a boot procedure or a secure boot procedure. During the initialization sequence, also referred to as a boot sequence, components of system 10 may be configured and enabled for operation and device drivers may be installed. Device drivers may provide an interface through which other components of the system 10 can communicate with a corresponding device. Firmware 972 may include a basic input-output system (BIOS) and/or include a unified extensible firmware interface (UEFI). Firmware 972 may also include one or more firmware modules of the information handling system. Additionally, configuration settings for the firmware 972 and firmware of the information handling system 10 may be stored in the NVRAM 970. NVRAM 970 may, for example, be a non-volatile firmware memory of the information handling system 10 and may store a firmware memory map namespace of the information handling system. NVRAM 970 may further store one or more container-specific firmware memory map namespaces for one or more containers concurrently executed by the information handling system.

Information handling system 10 may include additional components and additional busses, not shown for clarity. For example, system 10 may include multiple processor cores (either within processor 902 or separately coupled to chipset 906 or through the PCIe buses 908), audio devices (such as may be coupled to chipset 906 through one of PCIe busses 908), or the like. While a particular arrangement of bus technologies and interconnections is illustrated for the purpose of example, one of skill will appreciate that the techniques disclosed herein are applicable to other system architectures. System 10 may include multiple processors and/or redundant bus controllers. In some embodiments, one or more components may be integrated together in an integrated circuit (IC), which is circuitry built on a common substrate. For example, portions of chipset 906 can be integrated within processor 902. Additional components of information handling system 10 may include one or more storage devices that may store machine-executable code, one or more communications ports for communicating with external devices, and various input and output (I/O) devices, such as a keyboard, a mouse, and a video display.

In some embodiments, processor 902 may include multiple processors, such as multiple processing cores for parallel processing by information handling system 10. In some embodiments, information handling system 10 may support virtual machine (VM) operation, with multiple virtualized instances of one or more operating systems executed in parallel by the information handling system 10. For example, resources, such as processors or processing cores of the information handling system may be assigned to multiple containerized instances of one or more operating systems of the information handling system 10 executed in parallel. A container may, for example, be a virtual machine executed by the information handling system 10 for execution of an instance of an operating system by the information handling system. Thus, for example, multiple users may remotely connect to information handling system 10, such as in a cloud computing configuration, to utilize resources of the information handling system, such as memory, processors, and other hardware, firmware, and software capabilities of the information handling system 10. Parallel execution of multiple containers by the information handling system 10 may allow the information handling system to execute tasks for multiple users in parallel secure virtual environments.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the products, systems, and methods are not intended to be limited to the particular forms disclosed. Rather, they include all modifications and alternatives falling within the scope of the claims, and embodiments other than the one shown may include some or all of the features of the depicted embodiment. For example, elements may be omitted or combined as a unitary structure, and/or connections may be substituted. Further, where appropriate, aspects of any of the examples described above may be combined with aspects of any of the other examples described to form further examples having comparable or different properties and/or functions, and addressing the same or different problems. Similarly, it will be understood that the benefits and advantages described above may relate to one embodiment or may relate to several embodiments.

The claims are not intended to include, and should not be interpreted to include, means-plus- or step-plus-function limitations, unless such a limitation is explicitly recited in a given claim using the phrase(s) "means for" or "step for," respectively.

The invention claimed is:

1. An information handling system comprising:
   first and second housings that each have opposing front and rear edge portions, wherein the rear edge portion of the second housing is pivotally coupled to the rear edge portion of the first housing such that the first and second housings are pivotable between:
      an open state; and
      a closed state in which the front edge portion of the second housing is disposed closer to the front edge portion of the first housing than when the first and second housings are in the open state;
   a hinge cover that has opposing inner and outer surfaces and extends along at least a portion of the rear edge portion of each of the first and second housings; and
   a flexible printed circuit that has opposing upper and lower surfaces and extends between the first and second housings, wherein the flexible printed circuit includes:
      a cover segment in which the upper surface of the flexible printed circuit is fixed to the inner surface of the hinge cover;
      two housing segments, each fixed to the rear edge portion of a respective one of the first and second housings; and
      two free segments, each:
         movable relative to the hinge cover and to the first and second housings when the first and second housings pivot between the open and closed states;
         connecting a respective one of the housing segments to the cover segment; and
         underlying the inner surface of the hinge cover when the first and second housings are in the open state.

2. The information handling system of claim 1, wherein for each of the free segments:
   when the first and second housings are in the open state, the upper surface of the flexible printed circuit:
      is convex and subtends an angle that is greater than 90° in a first part of the free segment; and
      is concave and subtends an angle that is greater than 90° in a second part of the free segment; and
   the first part of the free segment connects the second part of the free segment to the cover segment.

3. The information handling system of claim 2, wherein for each of the free segments, in each of the first and second parts of the free segment, the angle that the upper surface of the flexible printed circuit subtends when the first and second housings are in the open state is larger than an angle that the upper surface of the flexible printed circuit subtends when the first and second housings are in the closed state.

4. The information handling system of claim 1, wherein in each of the free segments, the upper and lower surfaces of the flexible printed circuit are each perforated.

5. The information handling system of claim 1, wherein:
the inner surface of the hinge cover comprises an electrically-conductive material; and
the upper surface of the flexible printed circuit is fixed to the inner surface of the hinge cover at least with an electrically-conductive adhesive.

6. The information handling system of claim 1, wherein:
the first and second housings each comprise a metallic layer; and
each of the housing segments is fixed to the metallic layer of a respective one of the first and second housings at least with:
an electrically-conductive adhesive disposed between the metallic layer and the lower surface of the flexible printed circuit in the housing segment; and
a bracket that is fastened to the metallic layer and overlies the housing segment.

7. The information handling system of claim 6, comprising, for each of the housing segments, a layer of polymeric material disposed between the bracket and the upper surface of the flexible printed circuit in the housing segment.

8. The information handling system of claim 1, wherein:
a front face of the first housing is substantially parallel with a front face of the second housing when the first and second housings are in the open state; and
the front face of the first housing faces the front face of the second housing when the first and second housings are in the closed state.

9. The information handling system of claim 1, comprising:
a battery disposed in the first housing; and
a motherboard disposed in the second housing;
wherein the battery is electrically coupled to the motherboard via the flexible printed circuit.

10. The information handling system of claim 1, comprising a video display that:
is flexible; and
extends between the first and second housings.

11. A method of making an information handling system, the method comprising:
fixing an upper surface of a flexible printed circuit in a cover segment of the flexible printed circuit to an inner surface of a hinge cover;
while the upper surface of the flexible printed circuit in the cover segment is fixed to the inner surface of the hinge cover, coupling the hinge cover to first and second housings that each have opposing front and rear edge portions such that the hinge cover extends along at least a portion of the rear edge portion of each of the first and second housings, wherein the rear edge portion of the first housing is pivotally coupled to the rear edge portion of the second housing such that the first and second housings are pivotable between:
an open state; and
a closed state in which the front edge portion of the second housing is disposed closer to the front edge portion of the first housing than when the first and second housings are in the open state; and
fixing each of two housings segments of the flexible printed circuit to the rear edge portion of a respective one of the first and second housings;
wherein:
the flexible printed circuit includes two free segments that each connect a respective one of the housing segments to the cover segment; and
when the hinge cover is coupled to the first and second housings and the housing segments are each fixed to the rear edge portion of a respective one of the first and second housings, each of the free segments:
is movable relative to the hinge cover and to the first and second housings when the first and second housings pivot between the open and closed states; and
underlies the inner surface of the hinge cover when the first and second housings are in the open state.

12. The method of claim 11, wherein:
each of the free segments includes first and second parts, the first part connecting the second part to the cover segment; and
the method comprises shaping the flexible printed circuit such that the upper surface of the flexible printed circuit in the first part of each of the free segments is convex; and
the upper surface of the flexible printed circuit in the cover segment is fixed to the inner surface of the hinge cover after the shaping.

13. The method of claim 12, wherein for each of the free segments, when the first and second housings are in the open state, the upper surface of the flexible printed circuit:
is convex and subtends an angle that is greater than 90° in the first part of the free segment; and
is concave and subtends an angle that is greater than 90° in the second part of the free segment.

14. The method of claim 13, wherein for each of the free segments, in each of the first and second parts of the free segment, the angle that the upper surface of the flexible printed circuit subtends when the first and second housings are in the open state is larger than an angle that the upper surface of the flexible printed circuit subtends when the first and second housings are in the closed state.

15. The method of claim 14, wherein the hinge cover is coupled to the first and second housings when the first and second housings are in the open state.

16. The method of claim 14, wherein each of the housing segments is fixed to a respective one of the first and second housings when the first and second housings are in the closed state.

17. The method of claim 11, wherein fixing the upper surface of the flexible printed circuit in the cover segment to the inner surface of the hinge cover comprises adhering the upper surface of the flexible printed circuit in the cover segment to the inner surface of the hinge cover with an electrically-conductive adhesive.

18. The method of claim 11, wherein fixing each of the housing segments to the rear edge portion of a respective one of the first and second housings comprises:
adhering a lower surface of the flexible printed circuit that opposes the upper surface of the flexible printed circuit to a metallic layer of the housing with an electrically-conductive adhesive; and
fastening a bracket to the metallic layer such that the bracket overlies the housing segment.

19. The method of claim 18, wherein fixing each of the housing segments to the rear edge portion of a respective one of the first and second housings comprises disposing a layer of polymeric material on the housing segment such that the layer of polymeric material is disposed between the bracket and the upper surface of the flexible printed circuit in the housing segment.

20. An information handling system comprising:
first and second housings that each have opposing front and rear edge portions, wherein the rear edge portion of the second housing is pivotally coupled to the rear edge portion of the first housing such that the first and second housings are pivotable between:
  an open state; and
  a closed state in which the front edge portion of the second housing is disposed closer to the front edge portion of the first housing than when the first and second housings are in the open state;
a hinge cover that has opposing inner and outer surfaces and extends along at least a portion of the rear edge portion of each of the first and second housings; and
a flexible printed circuit that has opposing upper and lower surfaces and extends between the first and second housings, wherein the flexible printed circuit includes:
  a cover segment in which the upper surface of the flexible printed circuit is fixed to the inner surface of the hinge cover;
  two housing segments, each fixed to a respective one of the first and second housings; and
  two helical free segments, each:
    movable relative to the hinge cover and to the first and second housings when the first and second housings pivot between the open and closed states; and
  connecting a respective one of the housing segments to the cover segment.

* * * * *